(12) United States Patent
Sasaki et al.

(10) Patent No.: US 6,222,766 B1
(45) Date of Patent: Apr. 24, 2001

(54) EEPROM MEMORY CELL AND METHOD OF FABRICATING THE SAME

(75) Inventors: Katsuto Sasaki; Tsutomu Tsujimura, both of Shiga-ken (JP)

(73) Assignee: International Business Machiness Corporation, Armonk, NY (US)

( * ) Notice: Subject to any disclaimer, the term of this patent is extended or adjusted under 35 U.S.C. 154(b) by 0 days.

(21) Appl. No.: 09/481,915

(22) Filed: Jan. 12, 2000

(30) Foreign Application Priority Data

Jan. 12, 1999 (JP) .................................................. 11-005037

(51) Int. Cl.$^7$ .................................................... G11C 11/40
(52) U.S. Cl. .................................. 365/185.1; 365/185.05; 257/243
(58) Field of Search ..................................... 257/243, 396; 365/185.1, 189.01, 185.05

(56) References Cited

U.S. PATENT DOCUMENTS 5,606,521 * 2/1997 Kuo et al. ...................... 365/185.1

* cited by examiner

Primary Examiner—Terrell W. Fears
(74) Attorney, Agent, or Firm—Steven Capella

(57) ABSTRACT

An object of the present invention is to realize a memory cell including a single polysilicon layer so as to simplify the fabrication process, improve the productivity and lower the fabrication cost of the memory cell. Another object of the present invention is to realize a memory cell with a simple structure as well as to reduce the area of the memory cell so as to attain high integration. Still another object of the present invention is to form a fine memory cell by utilizing DHE (drain channel hot electrons) and GIDL (gate induced drain leakage).

An EEPROM memory cell 10 includes a substrate 12; a source region 14 and a drain region 16 formed on a surface of the substrate 12; a channel region 18 defined on the surface of the substrate 12 between the source region 14 and the drain region 16; a gate oxide film 20 formed on the channel region 18 so as to partly overlap with the source region 14 and the drain region 16; and a gate 22 including polysilicon formed on the gate oxide film 20.

9 Claims, 8 Drawing Sheets

| Vg [V] | Id(Write) [pA] | Id(Erase) [pA] |
|---|---|---|
| 0.0 | 7.1 | 7.9 |
| -1.0 | 7.0 | 6.7 |
| -2.0 | 34.5 | 5.8 |
| -3.0 | 372.0 | 9.4 |

| Write | Erase | Read |
|---|---|---|
| VD=6V, 100μs | VD=8.5V, 100μs | VD=3V |
| VG=9V, 100μs | VG=0V | VG=-3V |
| VS=0V | S-Open | S-Open |

EEPROM MEMORY CELL AND METHOD OF FABRICATING THE SAME

BACKGROUND OF THE INVENTION

The present invention relates to an EEPROM (electrically erasable and programmable ROM) memory cell and a method of fabricating the same, and more particularly, it relates to a novel EEPROM memory cell.

A conventional mass storage flash EEPROM memory 1 generally has a cell structure of a stacked MOSFET (hereinafter referred to as the CGFET) using gates 2 and 3 of two polysilicon (polycrystal silicon) layers as shown in FIG. 10. A charge storage portion in this structure corresponds to the floating gate 2, and electrons are injected/drawn through a tunnel oxide film 4 in general. Since this structure includes the gates 2 and 3 of two polysilicon layers, the fabrication process is complicated. In addition, owing to the complicated fabrication process, reliability is difficult to secure.

On the other hand, a typical example of a device including a gate of one polysilicon layer is an MNOS memory cell 5 as shown in FIG. 11. The MNOS memory cell 5 includes two gates 6 and 7 of polysilicon, and a silicon nitride ($Si_3N_4$) layer 8 and a thin thermally oxidized silicon film 9 are used as a gate insulating film. Data are written or erased in this memory cell while charge is stored in a trap formed in the vicinity of the interface between the silicon nitride layer 8 and the thermally oxidized silicon film 9 by the tunnel effect. Since this memory cell includes the two gates 6 and 7 aligned on the same plane, the area thereof is so large that higher integration is difficult to attain.

The applicant of the present invention searched for related arts before filing the present application, and found out an invention concerning an improved MNOS memory cell of this type, which is disclosed in National Publication of translated version No. 8-506693 (PCT/US93/05669). The invention disclosed in this publication relates to a flash EEPROM cell 130 including a single polysilicon layer as shown in FIGS. 12(*a*) and 12(*b*), and this cell 130 includes a (access) transistor 158 and an EEPROM transistor 162. The EEPROM transistor 162 includes a floating gate 160 and a control gate 142, so that charge can be stored in the floating gate 160 in the same manner as in the aforementioned conventional memory cell. In this flash EEPROM cell 130, the access transistor 158, the EEPROM transistor 162 and the control gate 142 forming a capacitor 170 are disposed on the same plane. Accordingly, the flash EEPROM cell 130 occupies a larger integration area than the conventional EEPROM memory cell, which is disadvantageous in attaining a high packing density.

This flash EEPROM cell 130 has the structure including the (access) transistor 158 and the EEPROM transistor 162. Furthermore, the flash EEPROM cell 130 includes the floating gate 160 and the control gate 142, and charge is stored in the floating gate 160.

Thus, there is a need for a memory cell with a gate structure including a single polysilicon layer so as to simplify the fabrication process, improve the productivity and lower the fabrication cost of the memory cell.

There is also a need for a memory cell with a simple structure as well as to reduce the area of the memory cell so as to attain high integration.

There is also a need for processes to form a fine memory cell by utilizing DHE (drain channel hot electrons) and GIDL (gate induced drain leakage).

SUMMARY OF THE INVENTION

The invention provides an EEPROM memory cell has a structure including only one polysilicon layer. The invention also enables the fabrication process can be simplified, the productivity to be improved, and the fabrication cost to be lowered. The EEPROM memory cell of the present invention has a simple structure and includes only one gate in a plane, making it advantageous in forming a fine memory cell. Thus, the invention permits reduction in area of the memory cell and enables high integration to be realized.

In one aspect, the invention encompasses an EEPROM memory having a MOSFET structure comprising a source region and a drain region formed on a surface of a substrate; a channel region defined on the surface of the substrate between the source region and the drain region; and a gate oxide film and a gate formed on the channel region, so that it is operated as a memory. A charge storage portion of this EEPROM memory cell is preferably a tunnel oxide film formed in the vicinity of the drain region, and the drain region and the gate oxide film (and the gate thereon) are preferably formed to have a large overlap region therebetween so as to easily generate a GIDL. In this EEPROM memory cell, data may be written by trapping hot electrons in the gate oxide film, and data is erased by injecting holes into the gate oxide film. Also, data may be read from this EEPROM memory cell by observing change of the GIDL in the drain region under application of a negative voltage to the gate.

The invention also encompasses methods of making EEPROM memory cells.

These and other aspects of the invention are described in further detail below.

DETAILED DESCRIPTION OF THE INVENTION

Now, embodiments of an EEPROM memory cell and a methods of fabricating the EEPROM memory cell according to the present invention will be described in detail with reference to the accompanying drawings.

Figure 1:
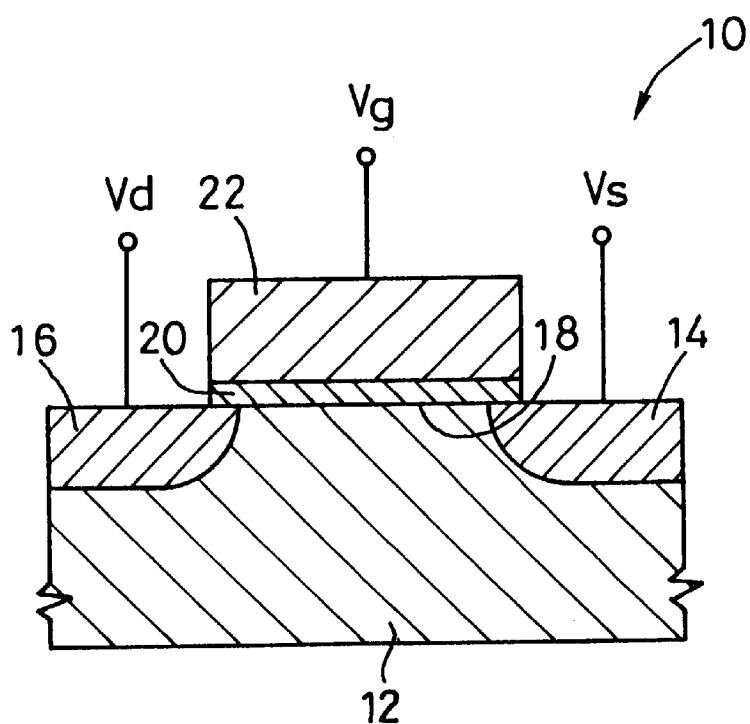
FIG. 1 is a schematic sectional view of an EEPROM memory cell according to one embodiment of the present invention.

As shown in FIG. 1, an EEPROM memory cell 10 according to this embodiment comprises a substrate 12; a source region 14 and a drain region 16 formed on the surface of the substrate 12; a channel region 18 defined on the surface of the substrate 12 between the source region 14 and the drain region 16; a gate oxide film 20 formed on the channel region 18 so as to partly overlap with the source region 14 and the drain region 16; and a gate 22 including polysilicon formed on the gate oxide film 20.

More specifically, the substrate 12 is preferably a p-type silicon substrate. When an n-type silicon substrate is used, a p well layer is formed on the n-type substrate. On the surface of the substrate 12, the source region 14 and the drain region 16 are formed from substantially symmetrical two $n^+$ regions by ion implantation. The ion implantation is carried out after forming the gate oxide film 20 and the gate 22, and the overlap regions between the gate 22 (and gate oxide film 20 below) and the $n^+$ regions, namely, the source region 14 and the drain region 16, are formed due to diffusion of impurity ions.

The gate oxide film 20 is preferably made from a thermally oxidized silicon film formed by thermally oxidizing the surface of the silicon substrate 12, a thermally oxidized composite film formed by thermally oxidizing the surface of the substrate 12 in the presence of a predetermined gas such as a $N_2O$ gas, a nitride film or an oxynitride film. Furthermore, the gate 22 is formed by depositing a polysilicon film on the gate oxide film 20 and patterning the polysilicon film together with the oxide film into a desired shape by photoetching.

The EEPROM memory cell 10 thus fabricated has the same structure as a MOSFET comprising an only single polysilicon layer. In order to operate the EEPROM memory cell 10 having this structure as a memory cell, data should be written in, erased from and read from the EEPROM memory cell 10.

First, a write operation of the EEPROM memory cell 10 is conducted by setting the potential Vd of the drain region 16 and the potential Vg of the gate 22 at a high voltage, while the potential Vs of the source region 14 is kept at ground. Thus, hot electrons are trapped from the channel region 18 in the gate oxide film 20 in the vicinity of the drain region 16.

An erase operation of the EEPROM memory cell 10 is conducted by maintaining the potential Vg of the gate 22 at the ground or a negative voltage and the potential Vd of the drain region 16 at a high voltage, with the potential Vs of the source region 14 opened. The mechanism is as follows: When a high voltage is applied to the drain region 16, holes are generated in the drain region 16 directly below the gate 22 due to band-to-band tunneling, and the holes are accelerated by the electric field of the substrate 12, thus causing avalanche breakdown. As a result, hot holes are generated to be injected into the gate oxide film 20. Thus, the electrons trapped in the gate oxide film 20 are electrically neutralized.

Next, a read operation of the EEPROM memory cell 10 is conducted by reading change of the drain current Id derived from GIDL caused in the drain region 16, with the potential Vg of the gate 22 set at a negative voltage, the potential Vd of the drain region 16 set at a high voltage, and the potential Vs of the source region 14 opened or kept at the ground. The GIDL that changes the drain current Id is controlled by charge of the gate oxide film 20. When electrons are trapped, the GIDL is several hundreds pA or more, and when electrons are erased, the GIDL is several pA. Thus, a two-figure current difference can be obtained between currents obtained before and after the write and erase operations. Accordingly, in the actually used flash EEPROM memory cell 10, the difference of the drain current derived from this GIDL is amplified by a sense amplifier so as to distinguish between 0 and 1 of bit data.

Since this EEPROM memory cell 10 is a memory cell having a simple structure including the gate 22 of only one polysilicon layer, the fabrication process can be simplified, the productivity can be improved, and the fabrication cost can be lowered. Also, since the EEPROM memory cell 10 includes only one gate 22, the area of the memory cell can be minimized, and high integration can be realized. For example, the EEPROM memory cell occupies an area of approximately 80 through 90% of the area occupied by a conventional stacked memory cell. Furthermore, the EEPROM memory cell 10 is operated by utilizing the DHE (drain channel hot electrons) in a write operation, the DHI (drain hole injection) in an erase operation and the GIDL (gate induced drain leakage) in a read operation, and hence, there is no need to provide a special cell structure. Accordingly, the EEPROM memory cell 10 is advantageous in forming a fine memory cell.

One embodiment of the basic structure of the EEPROM memory cell according to the present invention has been described so far, but the present invention is not limited to the above embodiment.

Figure 2:
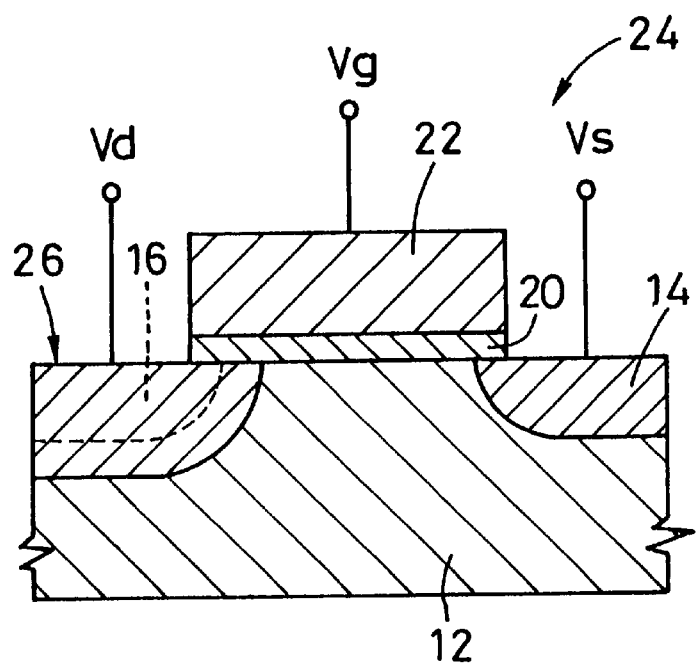
FIG. 2 is a schematic sectional view of an EEPROM memory cell according to another embodiment of the present invention.

For example, in another EEPROM memory cell 24, the overlap region between a gate 22 and a drain region 26 is preferably larger than the overlap region between the gate 22 and a source region 14 as shown in FIG. 2. When the overlap region between the gate 22 and the drain region 26 is thus larger, the GIDL is more easily generated in the drain region 26, which improves the performance of the EEPROM memory cell 24.

The EEPROM memory cell 24 having the aforementioned structure is fabricated as follows: First, after a gate oxide film 20 and the gate 22 are formed on a substrate 12 by a general method, ions are implanted at right angles into the substrate 12 to form a source region 14 and the drain region 26. Thereafter, ions are implanted into the drain region 26 in the substrate 12 obliquely aiming at least at the overlap region between the gate 22 and the drain region 26. In this manner, the overlap region between the gate 22 and the drain region 26 can be made larger.

Alternatively, even when the overlap region between the gate 22 and the drain region 26 is kept substantially in the same size as the overlap region between the gate 22 and the source region 14, ions can be obliquely implanted into the drain region 26 in the substrate 12, so as to form a diffusion layer doped at a higher concentration in the drain region 26 than that in the source region 14. Also in this case, the GIDL is more easily generated in the drain region 26, so that the performance of the EEPROM memory cell 24 is improved.

Figure 3:
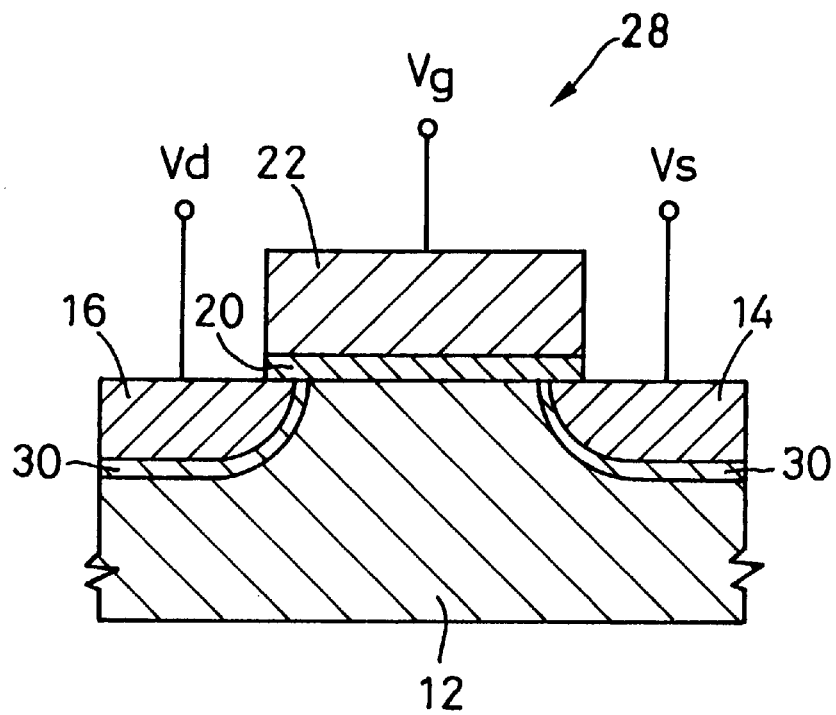
FIG. 3 is a schematic sectional view of an EEPROM memory cell according to still another embodiment of the present invention.

Moreover, in still another EEPROM memory cell 28, a $P^+$ layer 30 or a $P^-$ layer is preferably formed between a substrate 12 and source and drain regions 14 and 16 as shown in FIG. 3. It is sufficient to form the $P^+$ layer 30 or the $P^-$ layer at least between the drain region 16 and the substrate 12. The $P^+$ layer 30 or the $P^-$ layer can be formed by a known method. When the P⁺ layer 30 or the P⁻ layer is formed, a short channel effect can be suppressed and the efficiency to generate hot electrons can be improved.

The EEPROM memory cell and the method of fabricating the EEPROM memory cell according to the present invention have thus been described with reference to the drawings, however, the present invention can be practiced by further improving the aforementioned basic structure. In addition, the aforementioned embodiments can be appropriately combined. Various changes, alternations and modifications may be made to the embodiments on the basis of knowledge of those skilled in the art without departing from the scope and spirit of the present invention

EXAMPLES

Figure 4:
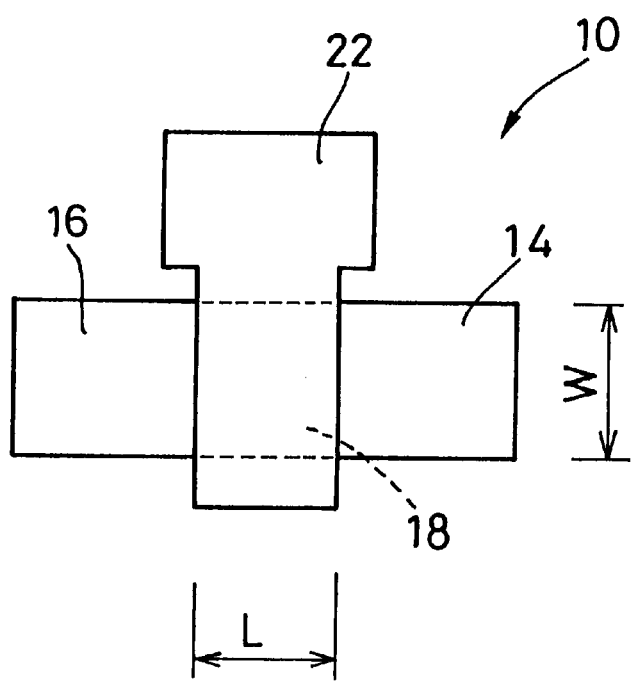
FIG. 4 is a schematic plan view of the EEPROM memory cell of FIG. 1.

An EEPROM memory cell having a structure as shown in FIGS. 1 and 4 was fabricated. On a silicon substrate 12, a gate oxide film 20 was formed by thermal oxidation. The thickness of the gate oxide film 20 was 100 Å. Furthermore, polysilicon was deposited as a gate 22 and then formed into a desired pattern. Thereafter, a source region 14 and a drain region 16 were formed by implanting ions by a general method by using the gate 22 as a mask. A channel region 18 thus formed had a channel width W of 0.7 μm and a channel length L of 0.8 μm.

Figure 5A:
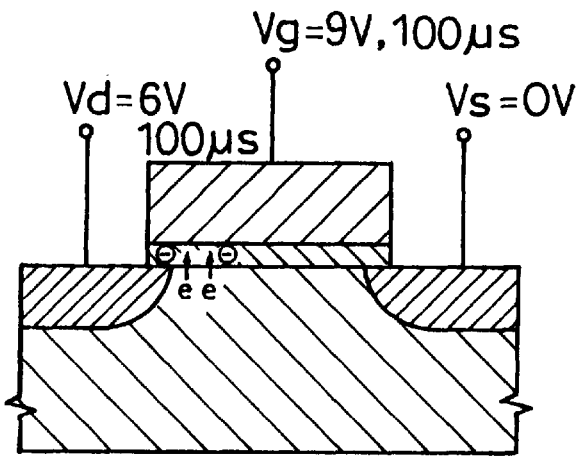
FIGS. 5(*a*) through 5(*c*) are diagrams illustrating a write operation, an erase operation and a read operation of the EEPROM memory cell of the present invention, respectively.
Figure 5B:
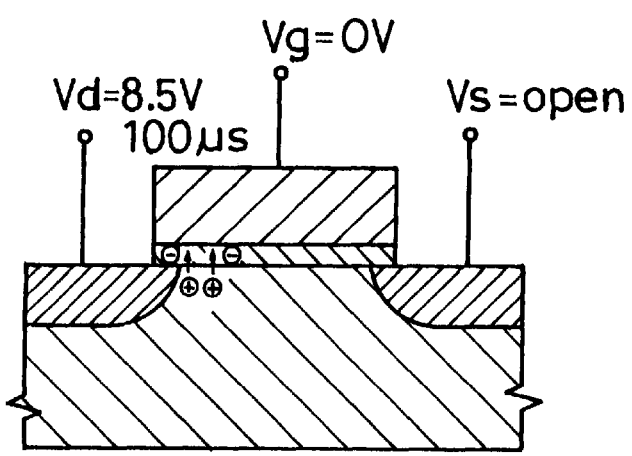
Figure 5C:
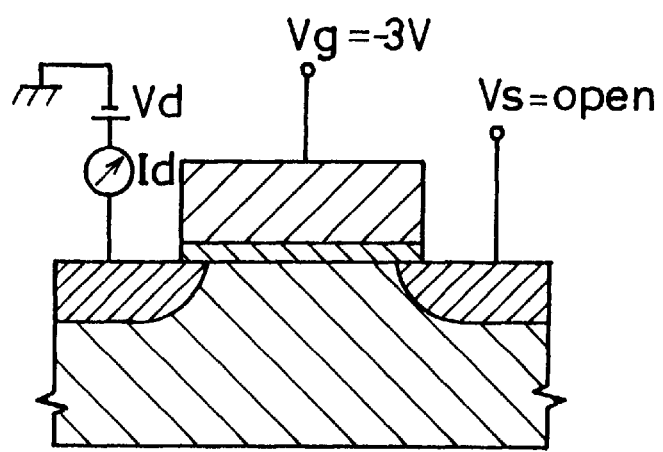
Figure 6:
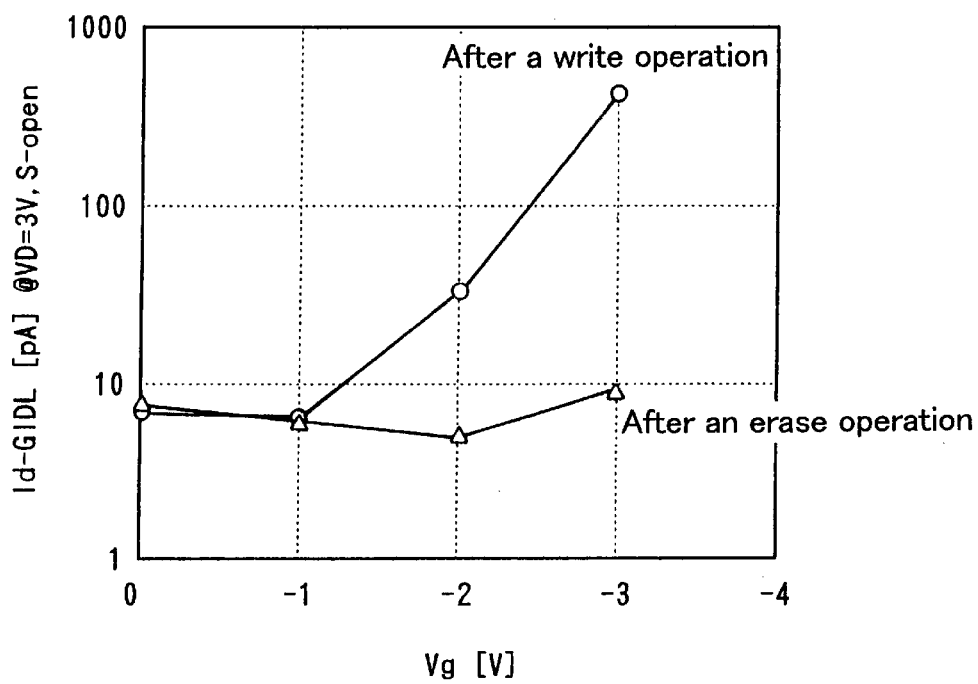
FIG. 6 is a diagram showing read currents obtained after conducting write and erase operations in the EEPROM memory cell of the present invention.

A read current characteristic of this EEPROM memory cell 10 was examined after a write operation. As shown in FIG. 5(a), a read operation in which voltages of 9 V and 6 V were respectively applied to the gate 22 and the drain region 16 with the source region 14 grounded was conducted once every 100 μs. Then, as shown in FIG. 5(c), with the source region 14 opened and with a voltage of 3 V applied to the drain region 16, voltages of 0.0 V, −1.0 V, −2.0 V and −3.0 V were successively applied to the gate 22, and a read current (drain current) Id was measured. As shown in FIG. 6, a larger read current Id was obtained by applying a larger negative voltage as the gate voltage Vg.

Further, a read current characteristic of the EEPROM memory cell 10 was examined after an erase operation. As shown in FIG. 5(b), the gate 22 was grounded, and holes were injected into the drain region 16 with a voltage pulse of 8.5 V and 100 μs. Thereafter, in the same manner as described above and shown in FIG. 5(c), with the source region 14 opened and with a voltage of 3 V applied to the drain region 16, voltages of 0.0 V, −1.0 V, −2.0 V and −3.0 V were successively applied to the gate 22, and then a read current (drain current) Id was measured. The results were shown in FIG. 6. As obvious from FIG. 6, the obtained read current Id had a substantially constant value regardless of the voltage applied to the gate 22.

Figure 7:
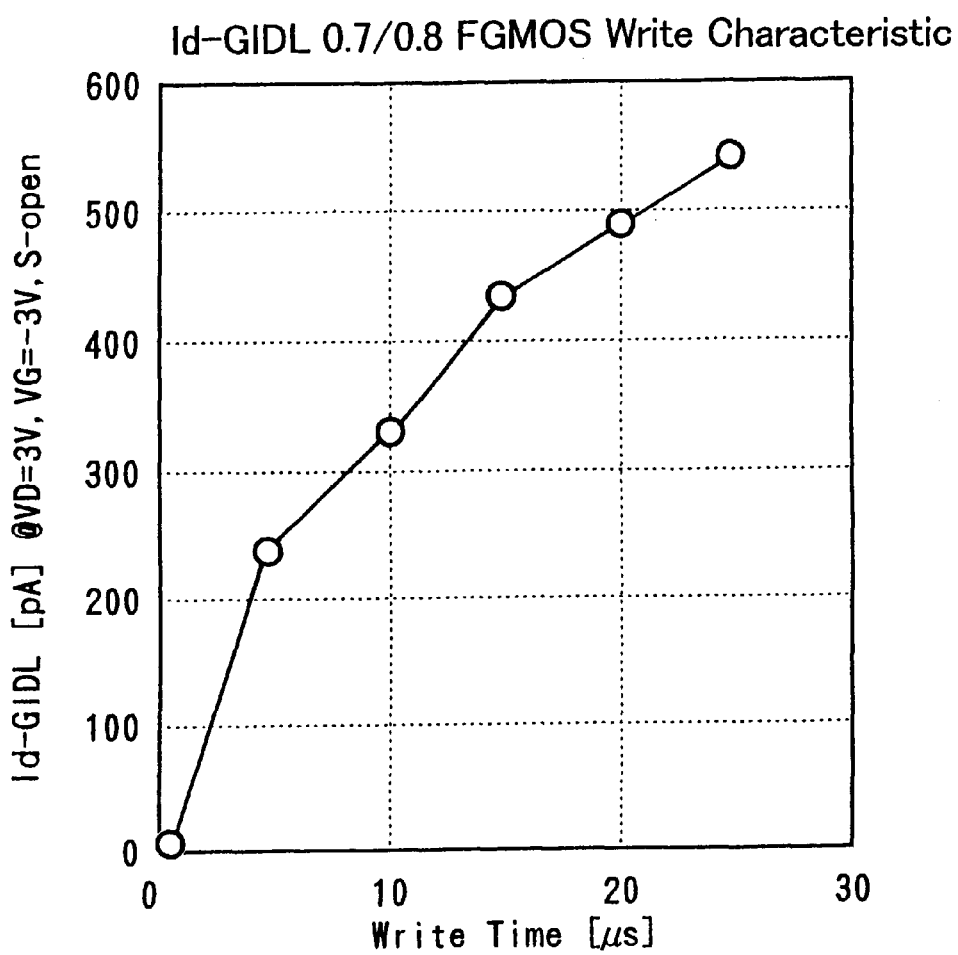
FIG. 7 is a diagram for showing a write characteristic of the EEPROM memory cell of the present invention.

Further, a write characteristic of the EEPROM memory cell 10 was examined. Under the conditions as shown in FIG. 5(a), a write operation was conducted five times every 5 μs. One read operation was conducted every one write operation with the source region 14 opened and with voltages of 3 V and −3 V applied to the drain region 16 and the gate 22, respectively. In this manner, the read current Id was measured. The results are shown in FIG. 7. As obvious from FIG. 7, as the number of times of the write operation is increased, the read current Id increase, which shows that the data was properly written.

Figure 8:
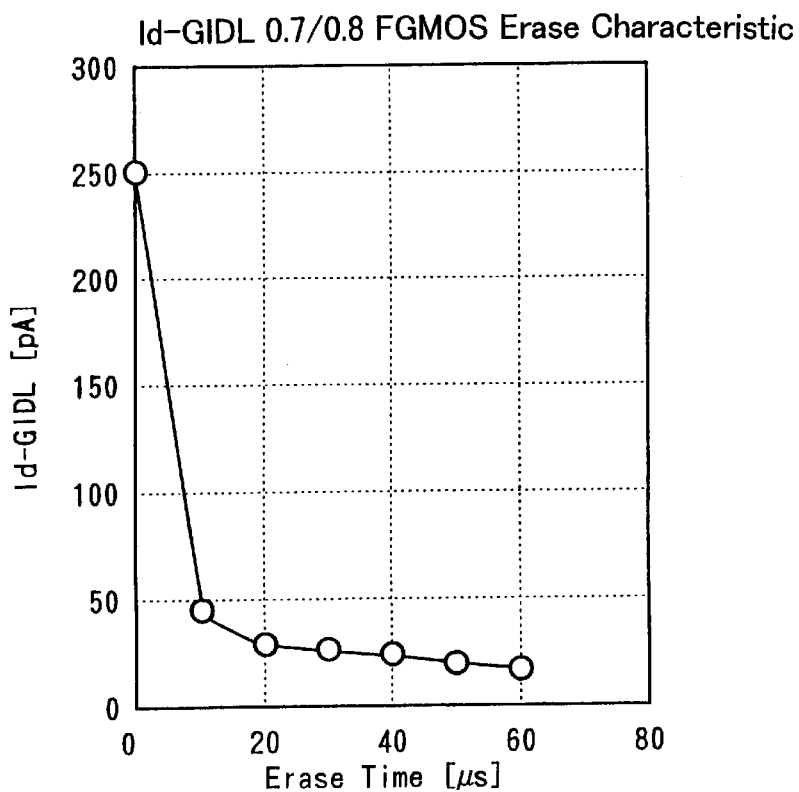
FIG. 8 is a diagram for showing an erase characteristic of the EEPROM memory cell of the present invention.

Further, an erase characteristic of the EEPROM memory cell 10 was examined. Under the conditions as shown in FIG. 5(b), an erase operation was conducted seven times every 10 μs. One erase operation was conducted every one read operation with the source region 14 opened and with voltages of 3 V and −3 V applied to the drain region 16 and the gate 22, respectively. In this manner, a read current Id was measured. The results are shown in FIG. 8. As obvious from FIG. 8, every time the erase operation is conducted, the read current Id decreases, which shows that data was properly erased.

Figure 9:
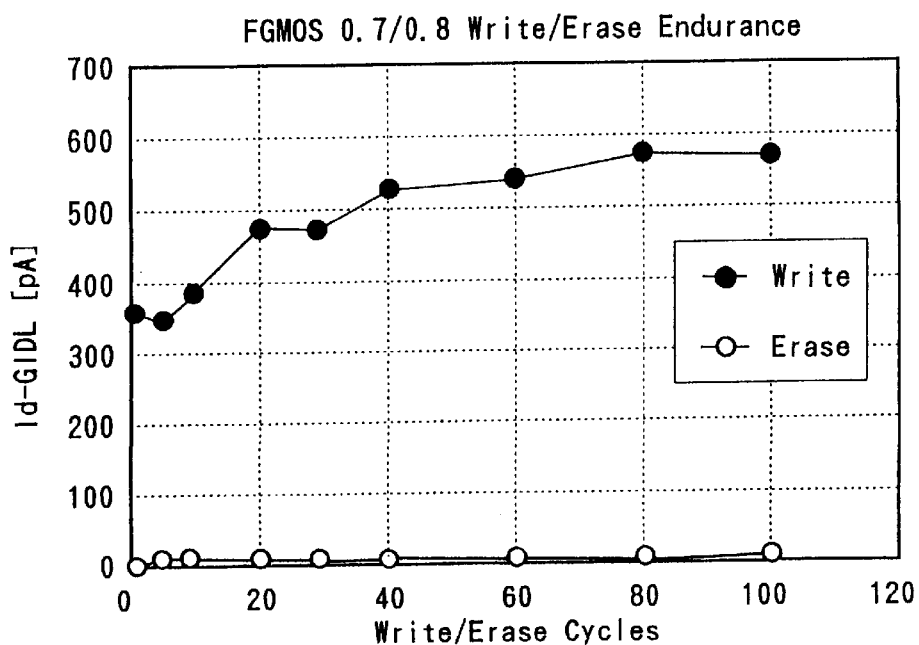
FIG. 9 is a diagram for showing write/erase endurance of the EEPROM memory cell of the present invention.
Figure 10:
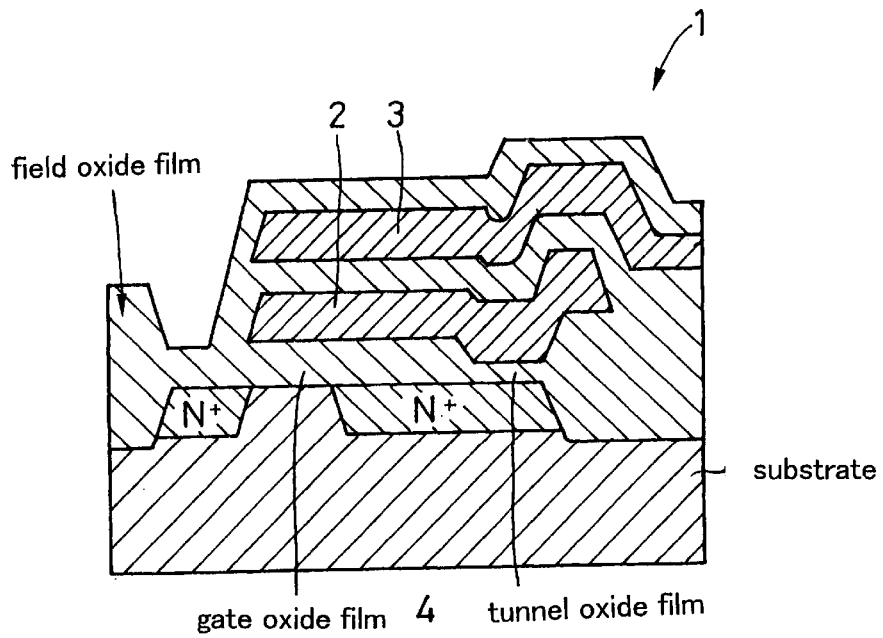
FIG. 10 is a schematic sectional view of a conventional flash EEPROM memory cell.
Figure 11:
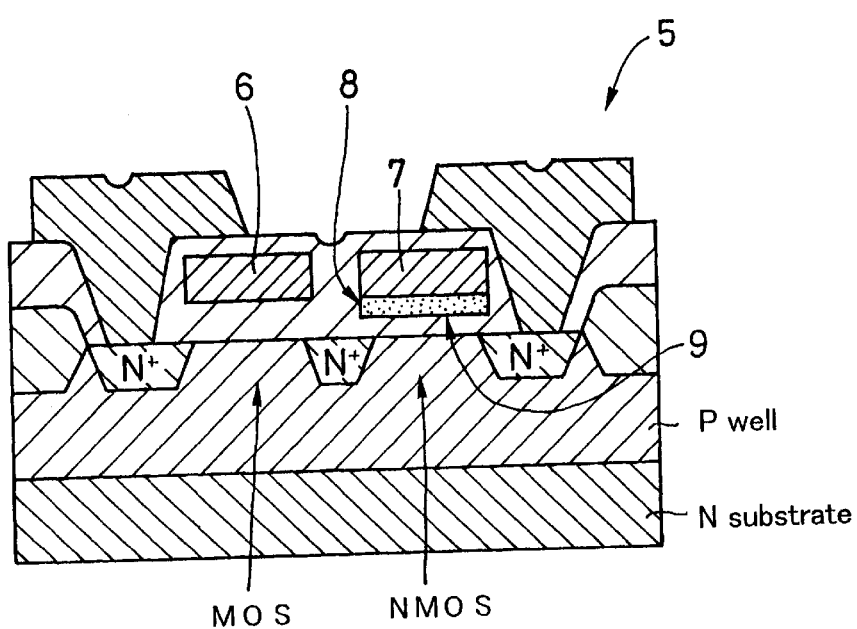
FIG. 11 is a schematic sectional view of a conventional MNOS memory cell.
Figure 12A:
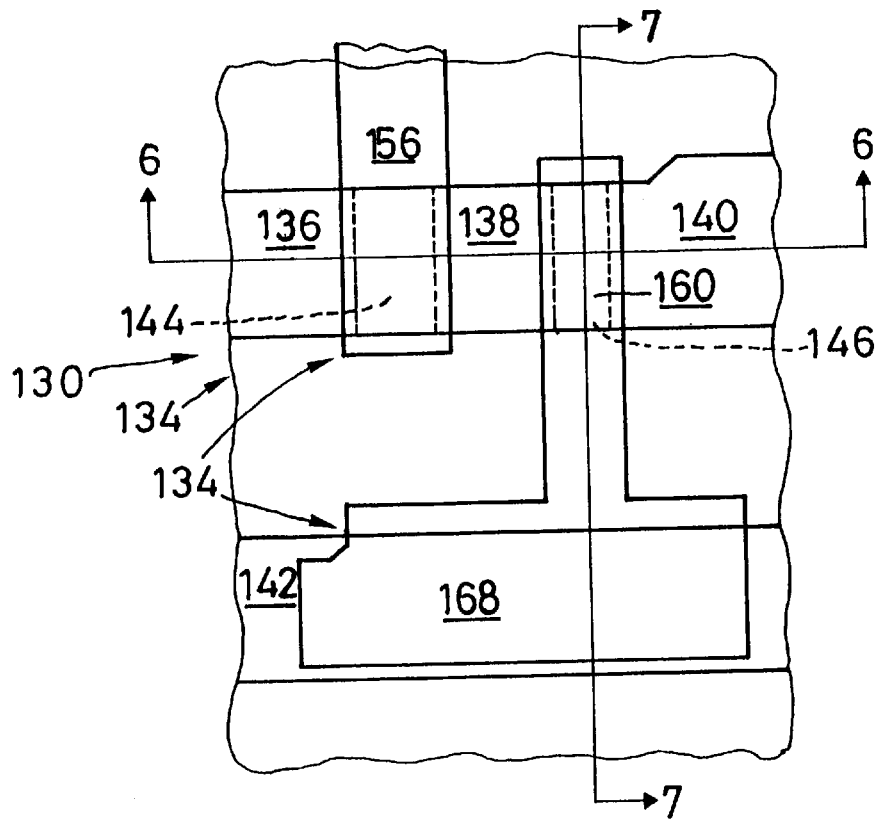
FIGS. 12(*a*) and 12(*b*) are a schematic plan view and a schematic sectional view of another conventional MNOS memory cell, respectively.
Figure 12B:
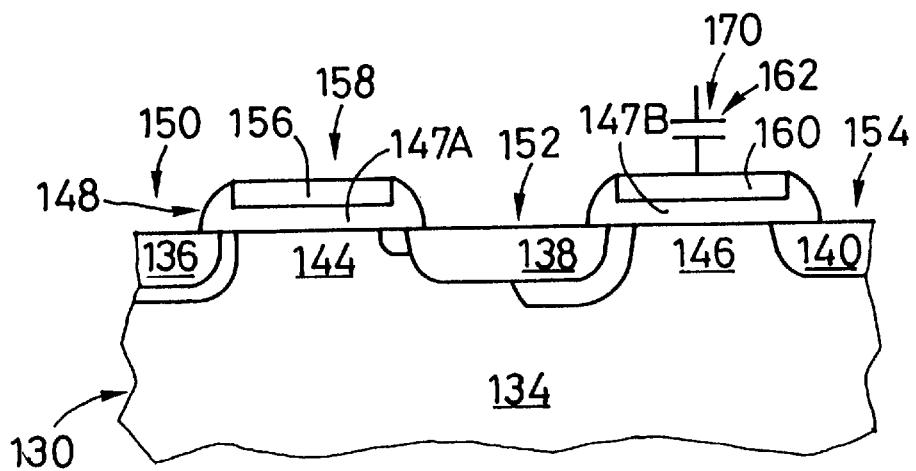

Further, write/erase endurance of the EEPROM memory cell 10 was examined. A write operation and an erase operation were alternately repeated. After conducting the predetermined number of times of the write operation, a read operation was conducted and a read current Id was measured. Subsequently, after conducting the predetermined number of times of the erase operation, a read operation was conducted and a read current Id was measured. The write operation, the erase operation and the read operation were conducted under the same conditions as described above. The results are shown in FIG. 9. As obvious from FIG. 9, although the read current Id increases after the write operation, there is no practical problem in the write/erase endurance, judging from the results obtained from 100 measurements.

Next, a data retention characteristic of the EEPROM memory cell 10 was examined. After data was written in the memory cell 10, the memory cell 10 was heated at 250° C. for 30 minutes and changes of the read currents obtained before and after the heating was examined. The results are shown in Table 1. As comparative examples, the charge retention characteristics of conventional stacked EEPROMs are also listed in Table 1. The retention characteristic of the present EEPROM memory cell heated at 250° C. for 30 minutes was excellent.

TABLE 1

|  | Before heating | After heating | Change ratio |
| --- | --- | --- | --- |
| Embodiment 1 | 199 pA | 197 pA | −1.0% |
| Embodiment 2 | 223 pA | 220 pA | −1.3% |
| Com. Example 1 | 3.87 V | 3.79 V | −2.1% |
| Com. Example 2 | 4.00 V | 3.93 V | −1.8% |

On the basis of the aforementioned data, it was confirmed that the EEPROM memory cell according to the present invention worked as a most basic memory cell.

What is claimed is:

1. An EEPROM memory cell comprising:

a substrate;

a source region and a drain region formed on a surface of said substrate;

a channel region defined on the surface of said substrate between said source region and said drain region;

a gate oxide film formed on said channel region so as to partly overlap with said source region and said drain region; and a gate including polysilicon formed on said gate oxide film.

2. The EEPROM memory cell according to claim 1, wherein the overlap region between said gate oxide film and said drain region is larger than the overlap region between said gate oxide film and said source region.

3. The EEPROM memory cell according to claim 1, wherein said drain region includes a diffusion layer doped at a higher concentration than a diffusion layer in said source region.

4. The EEPROM memory cell according to claim 1, wherein said source region and said drain region are formed from an n⁺ layer.

5. The EEPROM memory cell according to claim 4, wherein a P⁺ layer or a P⁻ layer is formed at least between said drain region and said substrate.

6. The EEPROM memory cell according to claim 1, wherein said gate oxide film is a thermally oxidized silicon film formed by thermally oxidizing the surface of said silicon substrate, or a thermally oxidized composite film formed by thermally oxidizing the surface of said substrate in the presence of a predetermined gas.

7. The EEPROM memory cell according to claim 1, wherein a write operation is conducted by trapping electrons in said gate oxide film in the vicinity of said drain region.

8. The EEPROM memory cell according to claim 7, wherein an erase operation is conducted by neutralizing the trapped electrons by injecting holes into said gate oxide film in the vicinity of said drain region.

9. The EEPROM memory cell according to claim 1, wherein a read operation is conducted by applying a negative voltage to said gate and reading change of a drain current derived from GIDL (gate induced drain leakage) caused in said drain region.

* * * * *